United States Patent [19]

Richter et al.

[11] 4,386,322
[45] May 31, 1983

[54] METHOD AND APPARATUS FOR PRODUCING A TRIGGER SIGNAL

[75] Inventors: Bruno Richter, Stegaurch bei Bamberg; Bernhard Brand, Niederwerrn, both of Fed. Rep. of Germany

[73] Assignee: Dipl.-Ing. Bruno Richter, Stegaurach bie Bamberg, Fed. Rep. of Germany

[21] Appl. No.: 215,553

[22] Filed: Dec. 11, 1980

[30] Foreign Application Priority Data

Dec. 21, 1979 [DE] Fed. Rep. of Germany ....... 2951677

[51] Int. Cl.³ .............................................. H03K 5/153
[52] U.S. Cl. ...................................... 328/63; 328/61; 328/109; 307/518; 307/269
[58] Field of Search ............... 328/151, 165, 109, 119, 328/120, 59, 60, 61, 63; 307/352, 353, 269, 517, 518

[56] References Cited

U.S. PATENT DOCUMENTS

| | | | |
|---|---|---|---|
| 4,044,311 | 8/1977 | Kashioka et al. | 328/151 X |
| 4,047,115 | 9/1977 | Toda et al. | 328/151 |
| 4,086,651 | 4/1978 | Muir et al. | 307/352 X |
| 4,093,923 | 6/1978 | McCormick | 328/151 X |
| 4,147,941 | 4/1979 | Curtice | 307/518 |
| 4,311,963 | 1/1982 | Watanabe et al. | 328/165 X |

*Primary Examiner*—John S. Heyman
*Attorney, Agent, or Firm*—Schwartz, Jeffery, Schwaab, Mack, Blumenthal & Koch

[57] ABSTRACT

An apparatus is provided for producing a trigger signal in accordance with the occurrence of an event, for example the end of the last pulse of a train of pulses, which occurs in an almost periodic manner within periodically consecutive time intervals and having a specific distinguishing feature relative to the remainder of the events occurring within each of said time intervals. The apparatus comprises a signal examination and time measurement circuit (3) which receives a signal on a rail (2) which represents the events and which determines the occurrence time of the event having the distinguishing feature. The output of the circuit (3) is provided to a holding circuit (6) which is controlled by a clock signal and which has its output connected to a signal modification circuit (8) which modifies the output signal of the circuit (6) so that it represents a slightly earlier time. The output of the circuit (8) is connected to the input of an enabling signal generator (9) which is responsive to an output signal of the circuit (3) and which produces an enabling signal on a rail (11) shortly before the event having the specific distinguishing feature occurs. The enabling signal is provided to one input of a signal combining circuit (12), the other input of which receives the signals provided on the rail (2) and at the output of which there is provided the trigger signal.

9 Claims, 3 Drawing Figures

METHOD AND APPARATUS FOR PRODUCING A TRIGGER SIGNAL

BACKGROUND OF THE INVENTION

This invention relates to a method of, and an apparatus for, producing a trigger signal in accordance with the occurrence of an event occurring in an almost periodic manner within periodically consecutive time intervals and having a specific distinguishing feature relative to the remainder of the events occurring within each of said time intervals.

In particular applications, a trigger signal is required dependent on the occurrence of an event the significance of which is not recognised immediately on its occurrence and is only recognised at a later stage, for example at the end of the relevant time interval. For example, where a trigger signal is required to be produced on the last pulse of a series of pulses the number of which varies or for the highest amplitude pulse of a series of pulses of varying amplitude it is only possible to determine at the end of the train of pulses or at the end of the relevant time interval which pulse was destined to produce the trigger signal.

Known apparatus for producing a trigger signal of the above-mentioned type are thus only able to produce the trigger signal at the end of a specific delay following the occurrence of the relevant event. For example, the duration of a mainly periodically repeating pulse train has been determined by causing the individual pulses to enable a counter and transferring the output of the counter to a memory at the end of each individual pulse whilst permitting the counter to continue counting during the pauses between the pulses. At the end of the relevant time interval the memory then contains a value which corresponds to the duration of the pulse train.

In addition to the delay in producing the trigger signal indicating the end of the pulse sequence following the end of the pulse sequence, a disadvantage of this known apparatus is that the transfer of the output of the counter to the memory cannot be carried out with sufficient speed in many cases thereby limiting the operating frequency of the apparatus.

It is accordingly an object of this invention to provide a new or improved method of and apparatus for producing a trigger signal in which the above-mentioned disadvantages are overcome or reduced.

SUMMARY OF THE INVENTION

According to one object of this invention there is provided a method of producing a trigger signal in accordance with the occurrence of an event occurring in an almost periodic manner within periodically consecutive time intervals and having a specific distinguishing feature relative to the remainder of the events occurring within each of said time intervals. The method comprises examining during each time interval, features of the events occurring in the time interval in order to determine the occurrence time of an event having a specific distinguishing feature and producing a signal representative of said occurrence time, and then in a subsequent time interval generating an enabling signal shortly before the time in the subsequent time interval which corresponds to said event occurrence time in the earlier time interval in order to produce the trigger signal.

According to another aspect of this invention there is provided an apparatus for producing a trigger signal in accordance with the occurrence of an event occurring in almost periodic manner within periodically consecutive time intervals and having a specific distinguishing feature relative to the remainder of the events occurring within each of said time intervals. The apparatus comprises a signal examination and time measurement circuit arranged to receive a signal representing the occurrence of the event to be examined and to produce an output signal which represents for each time interval the occurrence time of the event having the distinguishing feature, a holding circuit responsive to the output of the signal examination and time measurement circuit and arranged to be controlled by a clock signal representative of the periodically consecutive time intervals, a signal modification circuit responsive to the output signal of the holding circuit for modifying the output signal so that it represents a slightly earlier time, an enabling signal generator responsive to the output signal of the signal modification circuit and arranged to receive a signal representing time, and a signal combining circuit responsive to the output of the enabling signal generator and arranged to receive said signal representing the occurrence of events to be examined for producing the trigger signal.

BRIEF DESCRIPTION OF THE DRAWINGS

The invention will now be described in more detail, by way of example, with reference to the accompanying drawings in which.

DESCRIPTION OF THE PREFERRED EMBODIMENTS

Figure 1:
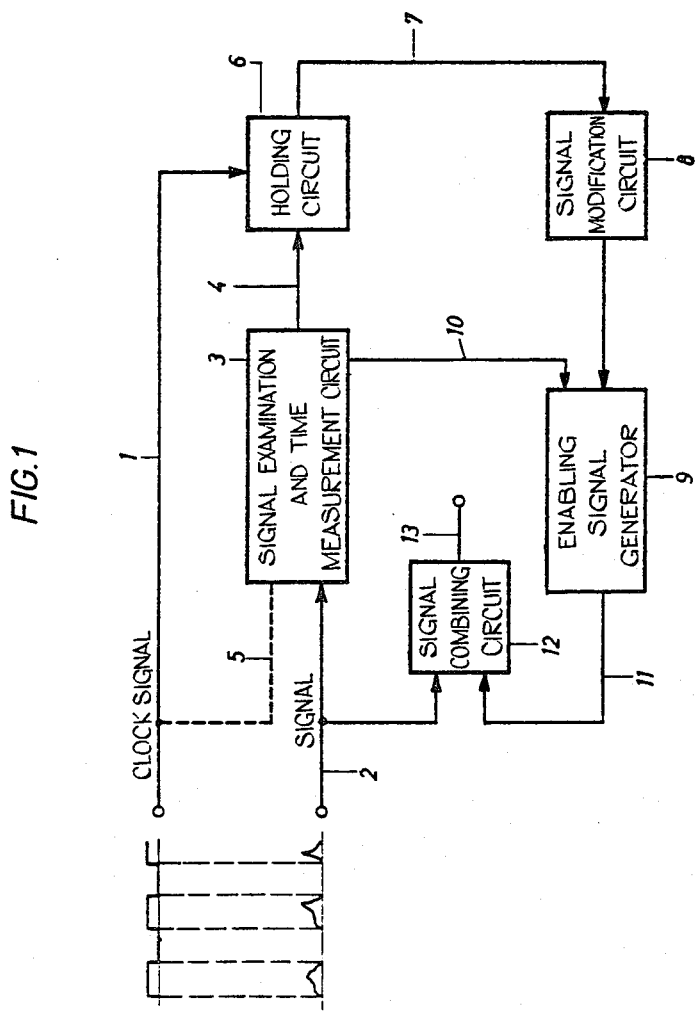
FIG. 1 is a simplified block diagram of an apparatus for producing a trigger signal embodying this invention.

Referring now to FIG. 1, in the apparatus there shown there is provided a clock signal rail 1 and a signal rail 2. Signals corresponding to the events to be investigated occur in a mainly periodic manner on the signal rail 2 in synchronism with the clock signal provided on the clock signal rail 1. In accordance with the occurrence of a specific event on the signal rail 1 during a predetermined time period, for example in accordance with the occurrence of the highest signal amplitude on conductor 2 or in accordance with the beginning or end of a set of signals the time of which is variable, a trigger signal is produced. In order to achieve this, the signals to be investigated for a specific feature are supplied by a the signal rail 2 to the input of a signal examination and time measurement circuit 3 in which the features of the signals are compared within the periodically consecutive time intervals and the event having the specific feature which is to produce the triggering signal is determined.

The signal examination and time measurement circuit 3 provides on an output rail 4 a signal indicating the occurrence time of the event having the specific feature in relation to a reference point in time in the relevant time interval. If the time reference point is the beginning of the time interval, then the signal examination and time measurement circuit 3 is connected to the clock signal rail 5 as indicated by the dotted line in FIG. 1. If the time reference point depends on the occurrence of a signal feature different from that producing the trigger signal, then the connection 5 can be eliminated and the signal examination and time measurement circuit may include a circuit means for deriving a reference signal from the signals occurring on the signal rail 2.

The output of the signal examination and time measurements circuit 3 is connected to the input of a holding circuit 6 which is controlled by the clock signal provided on the clock signal rail 1 and which holds the output signal provided on the output rail 4 for a predetermined period so that this signal remains available in an output rail 7 during the subsequent time interval.

The signal provided on the output rail 7 thus represents the duration between the time reference point in each time interval and the occurrence of the signal having the specific feature which is to cause the production of the trigger signal. This output rail 7 is connected to the input of a signal modification circuit 8 which modifies the signal so that it represents a slightly earlier time. The output of the signal modification circuit 8 is connected to one input of an enabling signal generator 9, the other input of which receives by way of a rail 10 an output from the signal examination and time measurement circuit 3 which represents the time elapsing from the pre-selected time reference point within each time interval. When the signal provided on the rail 10 coincides with that provided at the output of the signal modification circuit 8, the enabling signal generator 9 provides an enabling signal on its output rail 11, and the enabling signal is combined with the signals provided on the signal rail 2 in a signal combining circuit 12 to produce the trigger signal on output rail 13.

It is to be noted that in the arrangement shown in FIG. 1 it is assumed that the signal which determines production of the trigger signal does not occur in the successive time intervals in a strictly periodic manner at the same time reference point, but that this signal may be anticipated periodically within a given tolerance range. If the signal did occur in a strictly periodic manner, there would be no difficulty in producing the trigger signal. In the arrangement of FIG. 1, for each of the time intervals an anticipatory time interval is established for the subsequent time interval during which it is expected that the signal having the specific feature will occur. In the subsequent time interval, the signal combining circuit is enabled at the beginning of the anticipatory time interval and the signal combining circuit can then respond directly on occurrence of the signal having this specific feature in this time interval.

Figure 2:
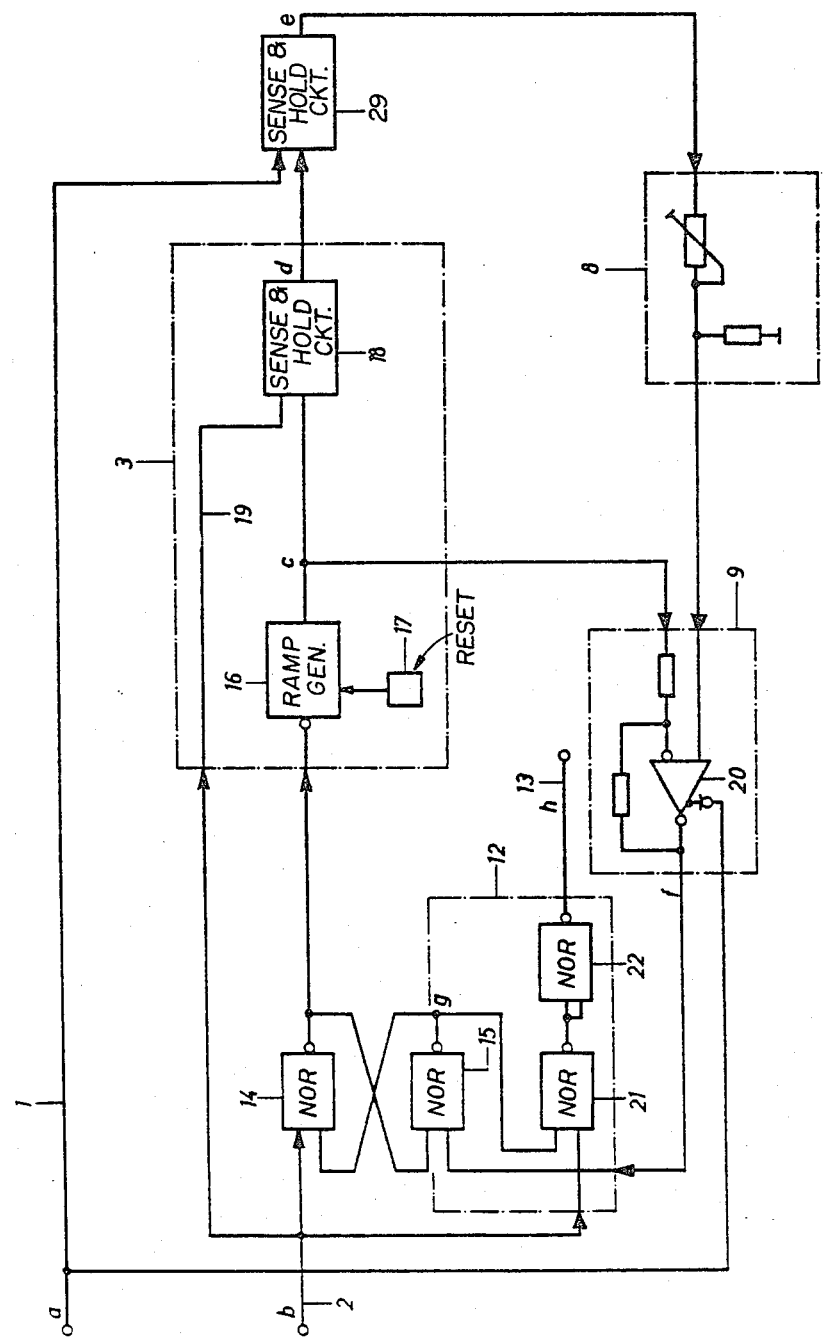
FIG. 2 is a detailed circuit diagram of the apparatus shown in FIG. 1.

In FIG. 2 there is shown a practical example of the basic arrangement shown in FIG. 1 and in FIGS. 3a to 3h there are shown graphs representing the signals at the various circuit points in FIG. 2, the signal points being denoted by lower case letters.

Figure 3:
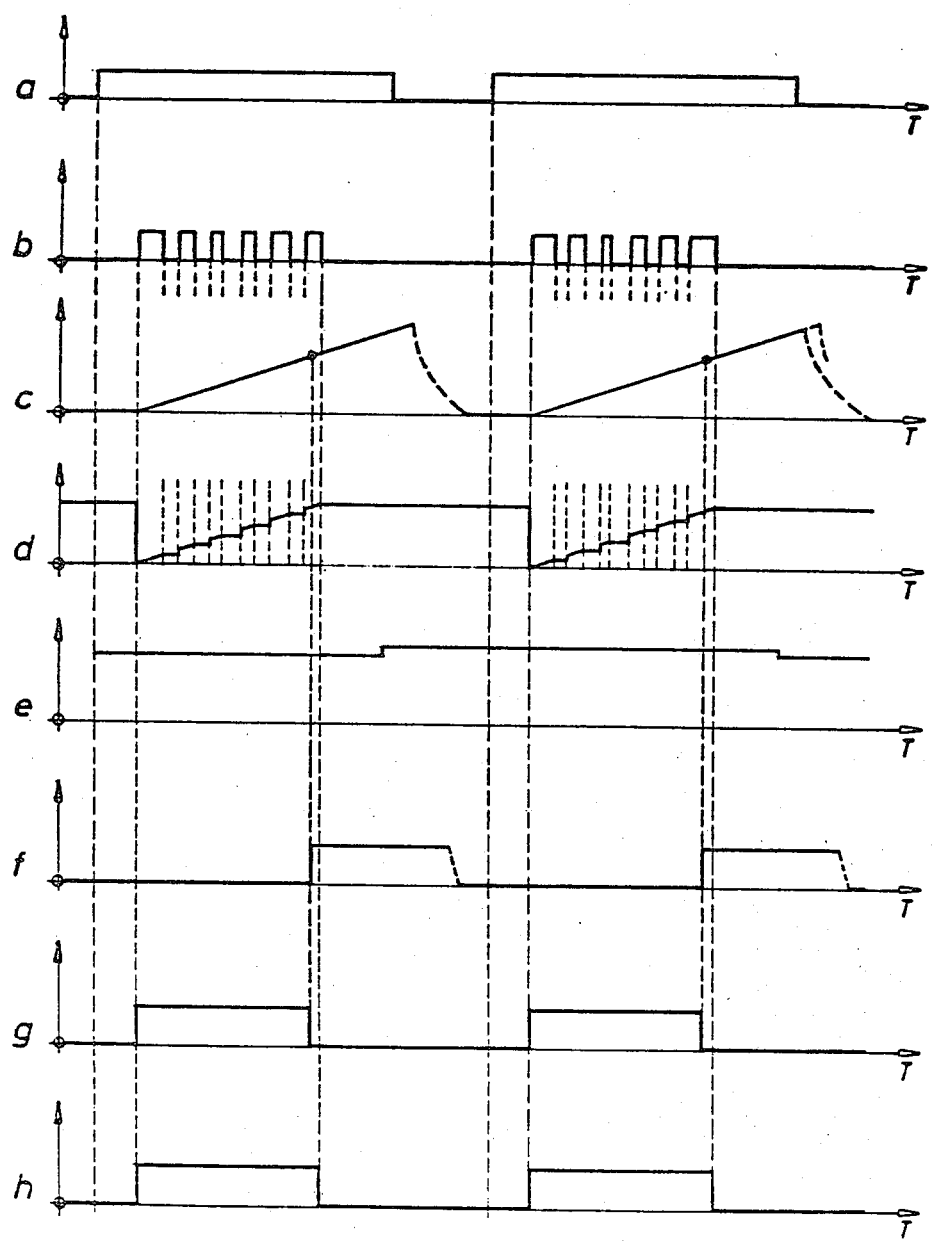
FIGS. 3a to 3h are graphs for explaining the operation of the circuit shown in FIG. 2.

As may be seen in FIG. 3a, the clock signal provided on rail 1 comprises a series of pulses of fixed duration which occur in a periodic manner in consecutive time intervals.

The signals occurring on the signal rail 2 comprise pulse trains of an almost periodic nature as shown in FIG. 3b. These pulses may be the output of a detector which forms part of a laser beam measuring system in which a test piece such as a glass rod is scanned at a predetermined frequency by laser beam and the interruption of the laser beam is sensed in order to obtain the desired measurement. Where, as shown in FIG. 3b, the presence of a pulse represents interruption of the laser beam, for example on sensing a glass rod, pauses between the pulses may be caused by the laser beam penetrating through the test piece from one point to another. Consequently, the required information for a specific test piece is not the duration of a single pulse but, in the case of the mainly periodic trains shown in FIG. 3b, the duration of each pulse train from the rising edge of the first pulse to the falling edge of the last pulse.

The signals on the signal rail 2 are provided to one input of a NOR gate 14 which is cross connected to a further NOR gate 15 and the output of which is connected to the input of a ramp generator 16, the ramp generator 16 being enabled during each successive time interval shown in FIG. 3a at the beginning of the first pulse of each train of pulses and which then provides a linearly rising output voltage. This output voltage is reset to zero at the end of each time interval and this may be achieved either by an automatic reset circuit 17 or by the clock signal provided on the clock signal rail 1.

The output signal of the ramp generator 16 is provided to the input of a first sensing and holding circuit 18, a further input of which receives the pulses supplied on the signal rail 2 by way of a rail 19. The sensing and holding circuit 18 is arranged as shown in FIG. 3d so that it provides at its output a voltage which the output voltage of the ramp generator 16 as shown in FIG. 3c during the presence of pulse of a pulse train shown in FIG. 3b but holds the last achieved voltage in the absence of a pulse.

The output of the sensing and holding circuit 18 is connected to the input of a second sensing and holding circuit 29 which corresponds to the holding circuit 6 shown in FIG. 1. The sensing and holding circuit 19 receives the output signal of the sensing and holding circuit 18 under the control of the clock siganl shown in FIG. 3a in such a manner that the output of the sensing and holding circuit 18 is transferred to the sensing and holding circuit 19 at the end of each clock pulse and this value is then held until the end of the subsequent clock period. The output signal of the sensing and holding circuit 19 is consequently a voltage signal which is brought to the level of the output of the sensing and holding circuit 18 at the end of each clock period and thereby indicates for the subsequent clock period the time at which during the previous clock period the last pulse of the pulse train occurred relative to the occurrence time of the first pulse. The output signal of the sensing and holding circuit 19 is supplied to the input of the signal modification circuit 8, which comprises an adjustable potential divider, and the circuit 8 attenuates the output signal of the sensing and holding circuit 19 by, for example, 5% to 10%, and this represents an advance in time of the time represented by the output signal of the sensing and holding circuit 19.

The output signal of the signal modification circuit 8 is supplied to one input of a comparator 20, the other input of which receives the output of the ramp generator 16. As shown in FIG. 3f, when the output signal of the ramp generator 16 coincides with the output signal of the signal modification circuit 8, an enabling signal is produced at the output of the comparator 20. The output of the comparator 20 is connected to one input of the NOR gate 15, the output of which is connected to one input of a NOR gate 21. The other input of NOR gate 21 is connected to the signal rail 2 and the output of this NOR gate is connected to the input of a NOR gate 22 connected as an inverter, the output of which is connected to the output rail 13 which provides the trigger signal. The NOR gates 15, 21 and 22 together form the signal combining circuit 12. The comparator 20 produces the enabling signal at the beginning of the period established by the signal modification circuit 8 and this enabling signal allows the signal combining circuit 12 to produce the trigger signal.

The output signal of the NOR gate 15 goes low when the comparator 20 produces the enabling signal thereby permitting the signal provided on the signal rail 13 to go low at the end of the last pulse of each pulse train as shown in FIGS. 3*f*, 3*g* and 3*h*. Thus, the duration of the pulse shown in FIG. 3*h* on the output rail 13 of the signal combining circuit 12 is precisely the same as the duration of the pulse train shown in FIG. 3*b*.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for producing a trigger signal upon the occurrence of a substantially periodic event which occurs within periodically consecutive time intervals and which has a distinguishing feature relative to other events occurring during said time interval, comprising:
   examining features of events occurring during each of said time intervals to determine when said event having said distinguishing feature occurs during a time interval;
   producing a signal representing the time at which said event occurs during said time interval;
   modifying said signal so that it represents a time earlier than the time at which said event occurs during said time interval;
   generating, in a subsequent time interval of said periodically conservative time intervals, a trigger preparation enabling signal at a time in the subsequent time interval which corresponds to said earlier time than the time at which said event occurred in the earlier time interval thereby permitting the production of said trigger signal at the time of occurrence of said event having the specific distinguishing feature during said subsequent time interval.

2. A method as claimed in claim 1 in which in each time interval the occurrence time of the event having a specific distinguishing feature is determined relative to the occurrence time of another event in the time interval.

3. A method as claimed in claim 2 in which the occurrence time of the event having a specific distinguishing feature is determined relative to the occurrence time of the first event occurring in the time interval.

4. A method as claimed in claim 1 in which in each time interval the occurrence time of the event having a specific distinguishing feature is determined relative to the beginning of the time interval.

5. An apparatus for producing a trigger signal in accordance with the occurrence of an event occurring in an almost periodic manner within periodically consecutive time intervals and having a specific distinguishing feature relative to the remainder of the events occurring within each of said time intervals, said apparatus comprising a signal examination and time and measurement circuit arranged to receive a signal representing the occurrences of the events to be examined and to produce an output signal which represents for each time interval the occurrence time of the event having the distinguishing feature, a holding circuit responsive to the output signal of the signal examination and time measurement circuit and arranged to be controlled by a clock signal representative of the periodically consecutive time intervals, a signal modification circuit responsive to the output signal of the holding circuit for modifying the output signals so that it represents a slightly earlier time, an enabling signal generator responsive to the output signal of the signal modification circuit and arranged to receive a signal representing time, and a signal combining circuit responsive to the output of the enabling signal generator and arranged to receive said signal representing the occurence of events to be examined for producing the trigger signal.

6. An apparatus as claimed in claim 5 in which the signal modification and time measurement circuit comprises a ramp signal generator arranged to commence generating a ramp signal at the point in time relative to which the occurrence time of the event having the specific distinguishing feature is determined and a sensing and holding circuit responsive to the output of the ramp signal generator and arranged to provide an output signal the voltage of which follows the output voltage of the ramp signal generator whilst a signal is present representing the occurrence of an event but which is held at its last previous value when no such signal is present, in which there is provided a second sensing and holding circuit which forms the holding circuit and which is arranged to hold the output voltage of the first sensing and holding circuit for a predetermined time, in which the signal modification circuit slightly attenuates the output voltage of the sensing and holding circuit, and in which the enabling signal generator comprises a comparator responsive to the output signal of the ramp signal generator and the output signal of the signal modification circuit and arranged to produce the enabling signal when the output voltage of the ramp signal generator coincides with the output voltage of the signal modification circuit.

7. An apparatus as claimed in claim 6 in which the ramp signal generator is arranged to be reset automatically after the end of each time interval.

8. An apparatus as claimed in claim 5, in which the modification achieved by the signal modification circuit is adjustable.

9. The use of the apparatus as claimed in claim 5 for sensing test pieces by using a detector which produces measuring signals at a predetermined sensing frequency.

* * * * *